(12) United States Patent
Smythe

(10) Patent No.: US 10,690,702 B2
(45) Date of Patent: *Jun. 23, 2020

(54) DISCRETE INPUT DETERMINING CIRCUIT AND METHOD

(71) Applicant: GE AVIATION SYSTEMS LLC, Grand Rapids, MI (US)

(72) Inventor: Douglas Clayton Smythe, Clearwater, FL (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/522,839

(22) Filed: Jul. 26, 2019

(65) Prior Publication Data

US 2019/0346488 A1 Nov. 14, 2019

Related U.S. Application Data

(63) Continuation of application No. 15/726,809, filed on Oct. 6, 2017, now Pat. No. 10,365,304.

(51) Int. Cl.
*G01R 19/00* (2006.01)
*G01R 15/04* (2006.01)
(Continued)

(52) U.S. Cl.
CPC ......... *G01R 19/0038* (2013.01); *G01R 15/04* (2013.01); *G01R 19/1659* (2013.01);
(Continued)

(58) Field of Classification Search
None
See application file for complete search history.

(56) References Cited

U.S. PATENT DOCUMENTS

| 4,055,777 A | 10/1977 | Black |
| 4,321,543 A | 3/1982 | Tuska |

(Continued)

FOREIGN PATENT DOCUMENTS

| CN | 201893771 | 7/2011 |
| CN | 202995310 | 6/2013 |

(Continued)

OTHER PUBLICATIONS

N.A. N.A.":, TPS3700-QI Window Comparator 1-13 for Over-and Undervoltage Detection", Jul. 1, 2017, 26 pages, URL: https://www.ti.com/lit/ds/symlink/tps3700-q1.pdf.

*Primary Examiner* — Cassandra F Cox
(74) *Attorney, Agent, or Firm* — McGarry Bair PC

(57) ABSTRACT

A discrete input determining circuit is disclosed, which includes an input biasing network connected to a discrete input for providing a first input voltage, a voltage divider network for dividing the first input voltage into a second input voltage and a third input voltage, a first comparator, wherein a non-inverting input terminal of the first comparator receives the second input voltage, and a second comparator, wherein an inverting input terminal of the second comparator receives the third input voltage, wherein an inverting input terminal of the first comparator and a non-inverting input terminal of the second comparator receive a reference voltage, and an output terminal of the first comparator and an output terminal of the second comparator are configured to provide a logic output. A discrete input determining method is also disclosed.

13 Claims, 2 Drawing Sheets

Figure 1:
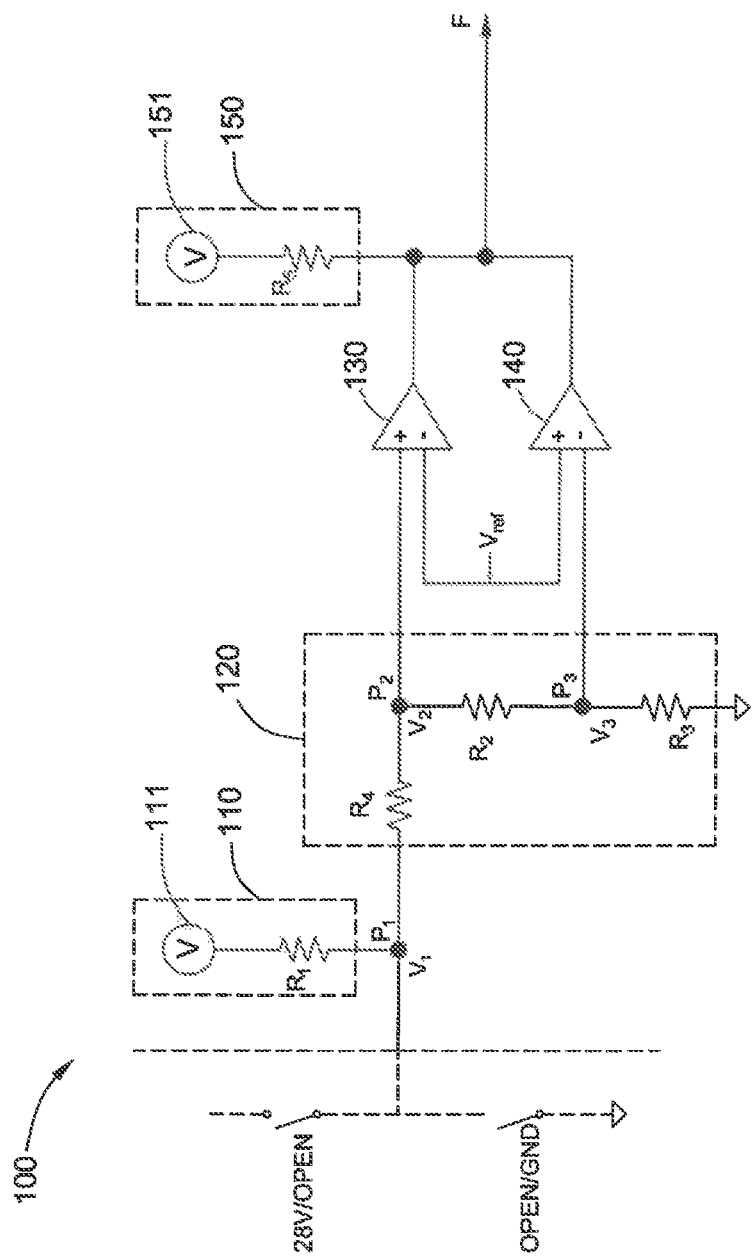

(51) Int. Cl.
*H02H 3/32* (2006.01)
*G01R 19/165* (2006.01)
*G01R 31/50* (2020.01)
*G01R 31/00* (2006.01)

(52) U.S. Cl.
CPC ....... *G01R 19/16557* (2013.01); *G01R 31/50* (2020.01); *H02H 3/32* (2013.01); *G01R 31/008* (2013.01)

(56) References Cited

U.S. PATENT DOCUMENTS

| | | | |
|---|---|---|---|
| 5,216,674 | A | 6/1993 | Dais et al. |
| 5,440,254 | A | 8/1995 | Sundby |
| 5,488,323 | A | 1/1996 | Beacham, Jr. et al. |
| 6,462,558 | B1 | 10/2002 | Taurand |
| 6,873,193 | B2 | 3/2005 | Kinoshita et al. |
| 8,710,872 | B2 | 4/2014 | Danklefsen et al. |
| 8,816,654 | B2 | 8/2014 | Kletti |
| 8,823,418 | B2 | 9/2014 | Chang et al. |
| 9,647,654 | B2 | 5/2017 | Kameyama |
| 10,365,304 | B2 * | 7/2019 | Smythe |
| 2007/0080007 | A1 | 4/2007 | Teramoto et al. |
| 2010/0026208 | A1 | 2/2010 | Shteynberg et al. |
| 2010/0134132 | A1 | 6/2010 | Price |
| 2011/0029266 | A1 | 2/2011 | Lee |
| 2011/0074435 | A1 | 3/2011 | Mizoguchi |
| 2011/0148384 | A1 | 6/2011 | Chung |
| 2011/0273102 | A1 | 11/2011 | van de Ven et al. |
| 2012/0075006 | A1 | 3/2012 | Vu et al. |
| 2012/0198908 | A1 | 8/2012 | Warneck |
| 2013/0002234 | A1 | 1/2013 | Marten |
| 2013/0307589 | A1 | 11/2013 | Danklefsen et al. |
| 2014/0095025 | A1 | 4/2014 | Gambrall |
| 2015/0270876 | A1 | 9/2015 | Kim |

FOREIGN PATENT DOCUMENTS

| | | |
|---|---|---|
| CN | 202998052 | 6/2013 |
| CN | 103618524 | 3/2014 |
| EP | 0556549 A | 8/1993 |
| EP | 0652517 A2 | 5/1995 |
| EP | 3396399 A1 | 10/2018 |
| FR | 2854286 A1 | 10/2004 |

* cited by examiner

DISCRETE INPUT DETERMINING CIRCUIT AND METHOD

CROSS REFERENCE TO RELATED APPLICATION(S)

This application claims priority to and benefit of U.S. patent application Ser. No. 15/726,809 filed Oct. 6, 2017, now allowed, which is incorporated herein in its entirety.

BACKGROUND

This disclosure relates generally to the field of aircraft, and more particularly to a discrete input determining circuit and a discrete input determining method.

Avionics products often provide circuits to read, ascertain or otherwise determine discrete inputs from other equipment in the aircraft. The discrete inputs may conform, for example, to one of two types: OPEN/GND or 28V/OPEN. Avionics products have typically used two different circuits to accommodate the two discrete types, providing internal pullups for the OPEN/GND discrete input and internal pulldowns for 28V/OPEN discrete input. Therefore, the avionics products have frequently provided a quantity of each circuit type to cover a variety of possible aircraft applications. For any given application, rarely are all the discrete inputs of both types utilized, and often there is a shortage of one type or the other. This may result in valuable hardware being left unused, reducing the flexibility and cost-effectiveness of the product.

BRIEF DESCRIPTION

In one aspect, the disclosure relates to a discrete input determining circuit, including an input biasing network connected to a discrete input for providing a first input voltage, a voltage divider network for dividing the first input voltage into a second input voltage and a third input voltage, a first comparator, wherein a non-inverting input terminal of the first comparator receives the second input voltage, and a second comparator, wherein an inverting input terminal of the second comparator receives the third input voltage. An inverting input terminal of the first comparator and a non-inverting input terminal of the second comparator receive a reference voltage, and an output terminal of the first comparator and an output terminal of the second comparator are configured to provide a logic output, and the voltage divider network comprises a second resistive load between the second input voltage and the third input voltage and a third resistive load between the third input voltage and a ground.

In another aspect, the disclosure relates to a method of determining a discrete input, including biasing the discrete input to provide a first input voltage, dividing the first input voltage into a second input voltage and a third input voltage by way of a disposing a second resistive load between the second input voltage and the third input voltage and a third resistive load between the third input voltage and a ground, comparing the second input voltage with a reference voltage and outputting a first output, comparing the reference voltage with the third input voltage and outputting a second output, and outputting a logic output by a logic function between the first output and the second output.

In yet another aspect, the disclosure relates to a method of determining a discrete input, including biasing the discrete input to provide a first input voltage, dividing the first input voltage into a second input voltage and a third input voltage, comparing the second input voltage with a reference voltage and outputting a first output, comparing the reference voltage with the third input voltage and outputting a second output, and outputting a logic output by a logic function between the first output and the second output. The first input voltage is less than a positive voltage of the discrete input, and the second input voltage is less than the first input voltage, and the third input voltage is less than the second input voltage

DRAWINGS

Figure 2:
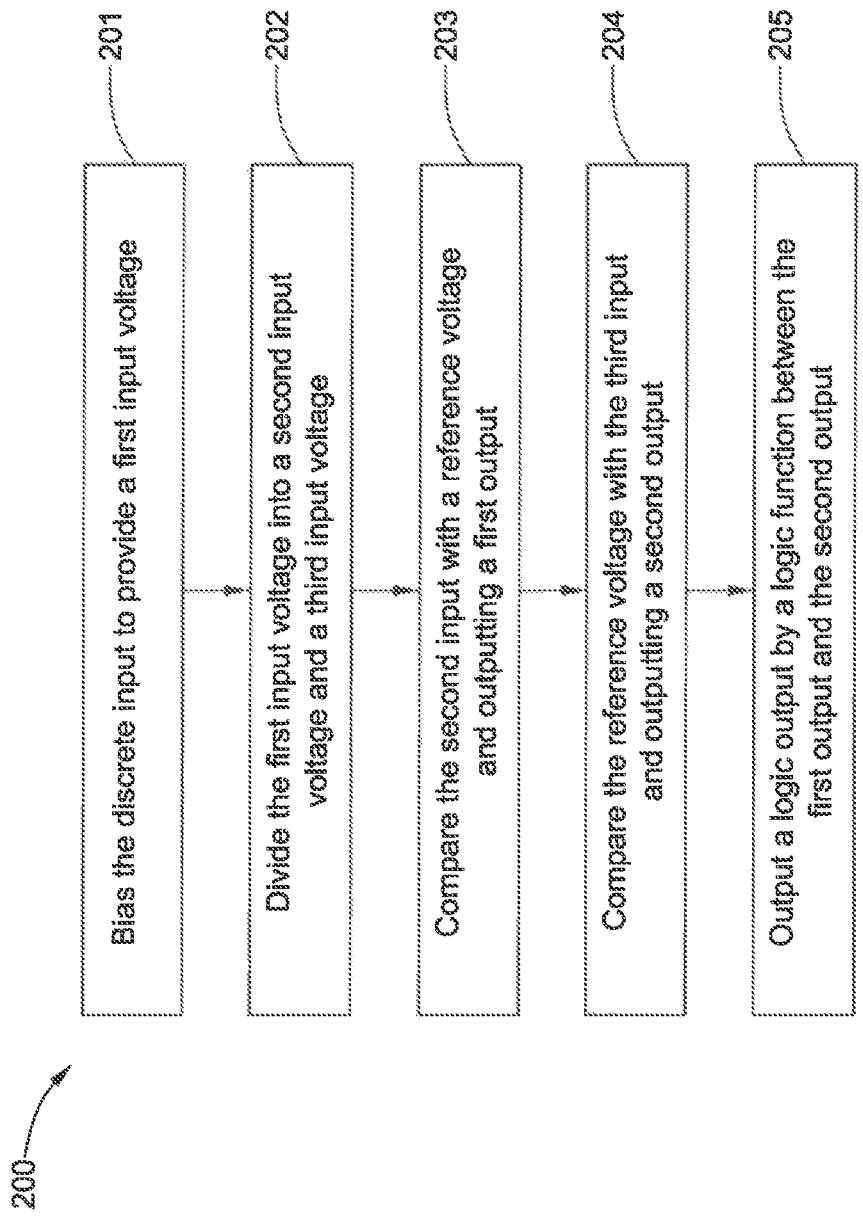

These and other features, aspects, and advantages of the present disclosure will become better understood when the following detailed description is read with reference to the accompanying drawings in which like characters represent like parts throughout the drawings, wherein:

FIG. 1 is an example schematic diagram of a discrete input determining circuit in accordance with aspects described herein; and FIG. 2 is an example flow chart of a discrete input determining method in accordance with aspects described herein.

DETAILED DESCRIPTION

Embodiments of the present disclosure will be described hereinbelow with reference to the accompanying drawings. In the following description, well-known functions or constructions are not described in detail to avoid obscuring the disclosure in unnecessary detail.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either or all of the listed items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. In addition, Terms indicating specific locations, such as "top", "bottom", "left", and "right", are descriptions with reference to specific accompanying drawings. Embodiments disclosed in the present disclosure may be placed in a manner different from that shown in the figures. Therefore, the location terms used herein should not be limited to locations described in specific embodiments.

FIG. 1 illustrates a schematic diagram of a discrete input determining circuit 100. As shown in FIG. 1, the discrete input determining circuit 100 comprises an input biasing network 110 connected to a discrete input for providing a first input voltage $V_1$, a voltage divider network 120 for dividing the first input voltage $V_1$ into a second input voltage $V_2$ and a third input voltage $V_3$, a first comparator 130 and a second comparator 140. A non-inverting input terminal "+" of the first comparator 130 receives the second input voltage $V_2$, and an inverting input terminal "−" of the second comparator 140 receives the third input voltage $V_3$. An inverting input terminal "−" of the first comparator 130 and a non-inverting input terminal "+" of the second comparator 140 receive a reference voltage $V_{ref}$. An output terminal of the first comparator 130 and an output terminal of the second comparator 140 are configured to provide a logic output F.

In one embodiment, the input biasing network 110 comprises a first power supply 111 and a first resistive load $R_1$. The first resistive load $R_1$ is connected between the discrete input and the first power supply 111, and a node $P_1$ between the discrete input and the first resistive load $R_1$ is connected to the voltage divider network 120. When the discrete input is in the OPEN state, the first input voltage $V_1$ is a voltage at the node $P_1$ and the first input voltage $V_1$ is less than a positive voltage V+ of the discrete input, for example, the positive voltage V+ is equal to 28 volts. It is to be appreciated that 28 volts is used herein for illustrative purposes; however, virtually any voltage would be within the scope of the subject innovation.

The voltage divider network 120 can include a second resistive load $R_2$ and a third resistive load $R_3$ connection in series between the node $P_1$ and a ground. The second input voltage $V_2$ is a voltage at a node $P_2$ between the node $P_1$ and the second resistive load $R_2$, and the third input voltage $V_3$ is a voltage at a node $P_3$ between the second resistive load $R_2$ and the third resistive load $R_3$. In this case, the second input voltage $V_2$ is less than the first input voltage $V_1$, and the third input voltage $V_3$ is less than the second input voltage $V_2$. In another embodiment, the voltage divider network 120 further comprises a fourth resistive load $R_4$ connection in series between the node $P_1$ and the node $P_2$, in this case, the second input voltage $V_2$ is less than the first input voltage $V_1$. In one embodiment, when the discrete input is in an OPEN state, the first input voltage $V_1$ is determined by the relationship among the first power supply 111, the first resistive load $R_1$, the second resistive load $R_2$, the third resistive load $R_3$, and the fourth resistive load $R_4$.

As for the first comparator 130, the non-inverting input terminal "+" can be connected to the node $P_2$ for receiving the second input voltage $V_2$, and the inverting input terminal "−" receives the reference voltage $V_{ref}$. For example, when the second input voltage $V_2$ is larger than the reference voltage $V_{ref}$, the first comparator 130 outputs a logic high level; when the second input voltage $V_2$ is less than the reference voltage $V_{ref}$, the first comparator 130 outputs a logic low level. As for the second comparator 140, the non-inverting input terminal "+" receives the reference voltage $V_{ref}$ and the inverting input terminal "−" is connected to the node $P_3$ for receiving the third input voltage $V_3$. When the third input voltage $V_3$ is larger than the reference voltage $V_{ref}$, the second comparator 140 outputs the logic low level; when the third input voltage $V_3$ is less than the reference voltage $V_{ref}$, the second comparator 140 outputs the logic high level. In an optional embodiment, the first comparator 130 and the second comparator 140 can be replaced by a window comparator or a dual comparator.

The output terminal of the first comparator 130 and the output terminal of the second comparator 140 can be open-collector type outputs that are wired together to implement a logic AND function so as to provide the logic output F, in this case, the discrete input determining circuit 100 further comprises an output configuration network 150, wherein the output configuration network 150 comprises a second power supply 151 and a fifth resistive load $R_5$ connected between the second power supply 151 and the logic output F.

The discrete input determining circuit 100 can accommodate both OPEN/GND and 28V/OPEN discrete input types, and application of the discrete input determining circuit is more flexible and cost effective. The logic output can be routed to any general-purpose input or output (GPIO) pin on a microprocessor or a field programmable gate array (FPGA) used for the host product data processing.

FIG. 2 illustrates a flow chart of a discrete input determining method 200 in accordance with an embodiment of the present disclosure. The discrete input determining method 200 may include the steps as follows.

In step 201, a first input voltage is provided by biasing a discrete input.

In step 202, the first input voltage is divided into a second input voltage and a third input voltage. In one embodiment, the first input voltage is less than the positive voltage of the discrete input, and the second input voltage is less than the first input voltage, and the third input voltage is less than the second input voltage.

In step 203, the second input voltage is compared with a reference voltage and a first output signal is outputted. In one embodiment, when the discrete input is in an OPEN state, the second input voltage is larger than the reference voltage so that the first output is a logic high level; when the discrete input is in the positive voltage state, the second input voltage is larger than the reference voltage so that the first output is the logic high level; when the discrete input is in a GND state, the second input voltage is less than the reference voltage so that the first output voltage is a logic low level.

In step 204, the reference voltage is compared with the third input voltage and a second output is outputted. In one embodiment, when the discrete input is in the OPEN state, the reference voltage is larger than the third input voltage so that the second output is the logic high level; when the discrete input is in the positive voltage state, the reference voltage is less than the third input voltage so that the second output is the logic low level; when the discrete input is in the GND state, the reference voltage is larger than the third input voltage so that the second output is the logic high level.

In step 205, a logic output is outputted by a logic function between the first output and the second output. In one embodiment, the logic function comprises a logic AND function, wherein when the discrete input is in the OPEN state, the logic output is the logic high level; when the discrete input is in the positive voltage state or the GND state, the logic output is the logic low level.

While steps of the discrete input determining method in accordance with embodiments of the present disclosure are illustrated as functional blocks, the order of the blocks and the separation of the steps among the various blocks shown in FIG. 2 are not intended to be limiting. For example, the blocks may be performed in a different order and a step associated with one block may be combined with one or more other blocks or may be sub-divided into a number of blocks.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

The invention claimed is:
1. A discrete input determining circuit, comprising:
an input biasing network connected to a discrete input for providing a first input voltage;

a voltage divider network for dividing the first input voltage into a second input voltage and a third input voltage;
a first comparator, wherein a non-inverting input terminal of the first comparator receives the second input voltage; and
a second comparator, wherein an inverting input terminal of the second comparator receives the third input voltage;
wherein an inverting input terminal of the first comparator and a non-inverting input terminal of the second comparator receive a reference voltage, and an output terminal of the first comparator and an output terminal of the second comparator are configured to provide a logic output; and
wherein the voltage divider network comprises a second resistive load between the second input voltage and the third input voltage and a third resistive load between the third input voltage and a ground.

2. The discrete input determining circuit according to claim 1, wherein the input biasing network comprises a first power supply and a first resistive load connected between the discrete input and the first power supply, and a node between the discrete input and the first resistive load is connected to the voltage divider network.

3. The discrete input determining circuit according to claim 1, wherein the first input voltage is less than a positive voltage of the discrete input.

4. The discrete input determining circuit according to claim 1, wherein the voltage divider network further comprises a fourth resistive load between the first input voltage and the second input voltage.

5. The discrete input determining circuit according to claim 1, wherein the output terminal of the first comparator and the output terminal of the second comparator are wired together to implement a logic AND function so as to provide the logic output.

6. The discrete input determining circuit according to claim 5, further comprising an output configuration network comprising a second power supply and a fifth resistive load connected between the second power supply and the logic output.

7. A method of determining a discrete input, comprising:
biasing the discrete input to provide a first input voltage;
dividing the first input voltage into a second input voltage and a third input voltage by way of a disposing a second resistive load between the second input voltage and the third input voltage and a third resistive load between the third input voltage and a ground;
comparing the second input voltage with a reference voltage and outputting a first output;
comparing the reference voltage with the third input voltage and outputting a second output; and
outputting a logic output by a logic function between the first output and the second output.

8. The method according to claim 7, wherein when the discrete input is in an OPEN state, the second input voltage is larger than the reference voltage so that the first output is a logic high level, and the reference voltage is larger than the third input voltage so that the second output is the logic high level.

9. The method according to claim 7, wherein when the discrete input is in a positive voltage state, the second input voltage is larger than the reference voltage so that the first output is a logic high level, and the reference voltage is less than the third input voltage so that the second output is a logic low level.

10. The method according to claim 7, wherein when the discrete input is in a GND state, the second input voltage is less than the reference voltage so that the first output is a logic low level, and the reference voltage is larger than the third input voltage so that the second output is a logic high level.

11. The method according to claim 7, wherein the logic function comprises a logic AND function, wherein the logic output is a logic high level when the discrete input is in an OPEN state, the logic output is a logic low level when the discrete input is in a GND state, and the logic output is a logic low level when the discrete input is in a positive voltage state.

12. A method of determining a discrete input, comprising:
biasing the discrete input to provide a first input voltage;
dividing the first input voltage into a second input voltage and a third input voltage;
comparing the second input voltage with a reference voltage and outputting a first output;
comparing the reference voltage with the third input voltage and outputting a second output; and
outputting a logic output by a logic function between the first output and the second output;
wherein the first input voltage is less than a positive voltage of the discrete input, and the second input voltage is less than the first input voltage, and the third input voltage is less than the second input voltage;
wherein the discrete input is any one of an OPEN state, positive voltage, and GND state;
wherein when the discrete input is in an OPEN state, the second input voltage is larger than the reference voltage so that the first output is a logic high level, and the reference voltage is larger than the third input voltage so that the second output is the logic high level;
wherein when the discrete input is in a positive voltage state, the second input voltage is larger than the reference voltage so that the first output is a logic high level, and the reference voltage is less than the third input voltage so that the second output is a logic low level;
wherein when the discrete input is in a GND state, the second input voltage is less than the reference voltage so that the first output is a logic low level, and the reference voltage is larger than the third input voltage so that the second output is a logic high level.

13. The method according to claim 12, wherein the logic function comprises a logic AND function, wherein the logic output is a logic high level when the discrete input is in an OPEN state, the logic output is a logic low level when the discrete input is in a GND state, and the logic output is a logic low level when the discrete input is in a positive voltage state.

* * * * *